(12) United States Patent
Singer et al.

(10) Patent No.: US 8,866,652 B2
(45) Date of Patent: Oct. 21, 2014

(54) APPARATUS AND METHOD FOR REDUCING SAMPLING CIRCUIT TIMING MISMATCH

(71) Applicant: Analog Devices, Inc., Norwood, MA (US)

(72) Inventors: Lawrence A. Singer, Wenham, MA (US); Siddharth Devarajan, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/975,291

(22) Filed: Aug. 24, 2013

(65) Prior Publication Data

US 2014/0253353 A1    Sep. 11, 2014

Related U.S. Application Data

(60) Provisional application No. 61/774,432, filed on Mar. 7, 2013.

(51) Int. Cl.
| | |
|---|---|
| *H03M 1/12* | (2006.01) |
| *G11C 27/02* | (2006.01) |
| *H03K 17/04* | (2006.01) |
| *H03K 17/041* | (2006.01) |
| *H03M 1/08* | (2006.01) |

(52) U.S. Cl.
CPC ........... *H03M 1/1245* (2013.01); *H03K 17/041* (2013.01); *H03M 1/0836* (2013.01); *G11C 27/024* (2013.01)
USPC .............. 341/122; 327/91; 327/296; 327/390

(58) Field of Classification Search
CPC .............. H03M 1/1245; H03M 1/1255; G11C 27/00–27/028; H03K 17/06; H03K 17/14; H03K 5/084

USPC .............. 341/122; 327/91, 94, 291, 295, 296, 327/383, 389, 390

See application file for complete search history.

(56) References Cited

U.S. PATENT DOCUMENTS

| | | | |
|---|---|---|---|
| 4,980,583 A | 12/1990 | Dietz | |
| 5,550,503 A | * 8/1996 | Garrity et al. | ................. 327/437 |
| 5,764,089 A | 6/1998 | Partovi et al. | |

(Continued)

OTHER PUBLICATIONS

K. Nagaraj et al., A Dual-Mode 700-Msamples/s 6-bit 200-Msamples/s 7-bit A/D Converter in a 0.25 micrometer Digital CMOS Process, IEEE Journal of Solid-State Circuits, vol. 35, No. 12, Dec. 2000.*

*Primary Examiner* — Howard Williams
(74) *Attorney, Agent, or Firm* — Patent Capital Group

(57) ABSTRACT

An example apparatus, system, and method for sampling in an interleaved sampling circuit having multiple channels. In an embodiment, an input clock is used to synchronize the transitions of sampling clocks from a first to second voltage level, relative to one another. The sampling clocks are input to a sampling circuit. The input clock switches a common switch that pulls each sampling clock to the second voltage level through a common path on input clock transitions from a first to a second clock state. The transition from the first to a second voltage level of each sampling clock triggers a sample taken on one of the channels. The first voltage level may be boosted to drive switches on in the sampling circuit. Synchronizing transitions of the outputs through the common switch and common path reduces timing mismatch between the sampling clocks controlling the channels.

24 Claims, 7 Drawing Sheets

(56) References Cited

U.S. PATENT DOCUMENTS

| | | |
|---|---|---|
| 5,841,299 A | 11/1998 | De |
| 5,841,304 A | 11/1998 | Tam |
| 5,877,635 A | 3/1999 | Lin |
| 5,886,562 A | 3/1999 | Garrity et al. |
| 5,900,759 A | 5/1999 | Tam |
| 5,952,851 A | 9/1999 | Yuen |
| 6,060,914 A | 5/2000 | Nunokawa |
| 6,060,927 A | 5/2000 | Lee |
| 6,087,872 A | 7/2000 | Partovi et al. |
| 6,104,643 A | 8/2000 | Merritt |
| 6,118,307 A | 9/2000 | Shi et al. |
| 6,118,326 A * | 9/2000 | Singer et al. .......... 327/390 |
| 6,160,508 A | 12/2000 | Gustavsson et al. |
| 6,316,960 B2 | 11/2001 | Ye |
| 6,369,616 B1 | 4/2002 | Lan et al. |
| 6,407,608 B1 | 6/2002 | Brown et al. |
| 6,486,706 B2 | 11/2002 | Ye et al. |
| 6,507,224 B1 | 1/2003 | Lee et al. |
| 6,542,017 B2 | 4/2003 | Manganaro |
| 6,570,410 B2 | 5/2003 | Manganaro |
| 6,771,203 B1 | 8/2004 | Nairn |
| 6,847,239 B2 | 1/2005 | Leifso et al. |
| 6,876,232 B2 | 4/2005 | Yoo |
| 6,900,750 B1 | 5/2005 | Nairn |
| 6,924,683 B1 | 8/2005 | Hayter |
| 6,977,528 B2 | 12/2005 | Kang et al. |
| 6,992,513 B2 | 1/2006 | Leifso et al. |
| 7,034,572 B2 | 4/2006 | Kim et al. |
| 7,126,507 B2 | 10/2006 | Lee |
| 7,135,899 B1 | 11/2006 | Sancheti et al. |
| 7,138,831 B2 | 11/2006 | Tobita |
| 7,176,742 B2 | 2/2007 | Aksin et al. |
| 7,180,349 B2 | 2/2007 | Leifso et al. |
| 7,230,454 B2 | 6/2007 | Welser et al. |
| 7,250,885 B1 | 7/2007 | Nairn |
| 7,253,675 B2 | 8/2007 | Aksin et al. |
| 7,385,440 B2 | 6/2008 | Aksin et al. |
| 7,443,331 B2 | 10/2008 | Cormier, Jr. |
| 7,460,039 B2 | 12/2008 | Jeon |
| 7,511,552 B2 | 3/2009 | Ali et al. |
| 7,557,618 B1 | 7/2009 | Wik |
| 7,609,756 B2 | 10/2009 | Wood |
| 7,772,914 B2 | 8/2010 | Jung |
| 7,816,951 B1 | 10/2010 | Lee |
| 7,898,288 B2 | 3/2011 | Wong |
| 7,969,234 B2 | 6/2011 | Jung |
| 8,169,246 B2 | 5/2012 | Malik et al. |
| 8,217,824 B2 | 7/2012 | Hernes et al. |
| 8,232,904 B2 | 7/2012 | Lee et al. |
| 8,294,512 B2 | 10/2012 | Lee et al. |
| 8,400,206 B2 | 3/2013 | Benzer |
| 8,471,720 B2 | 6/2013 | Turner et al. |
| 8,487,795 B1 * | 7/2013 | Jiang et al. .......... 341/122 |
| 8,487,803 B1 | 7/2013 | Garrity |
| 8,525,556 B2 | 9/2013 | Singh et al. |
| 8,604,962 B1 | 12/2013 | Lewyn |
| 8,610,613 B2 | 12/2013 | Ebata et al. |
| 2003/0020533 A1 * | 1/2003 | Price et al. .......... 327/536 |
| 2007/0194956 A1 | 8/2007 | Jeon |
| 2007/0290735 A1 | 12/2007 | Ali et al. |
| 2008/0048901 A1 | 2/2008 | Cormier |
| 2008/0074151 A1 | 3/2008 | Kim |
| 2008/0116963 A1 | 5/2008 | Jung |
| 2008/0136443 A1 | 6/2008 | Wong |
| 2008/0191772 A1 | 8/2008 | Pickering et al. |
| 2008/0272952 A1 | 11/2008 | Wood |
| 2008/0290921 A1 | 11/2008 | Park |
| 2009/0251188 A1 | 10/2009 | Kim |
| 2009/0284288 A1 | 11/2009 | Zhang et al. |
| 2009/0304139 A1 | 12/2009 | Tsai et al. |
| 2010/0109628 A1 | 5/2010 | Jung |
| 2010/0238057 A1 | 9/2010 | Wood |
| 2010/0253414 A1 | 10/2010 | Dedic et al. |
| 2011/0018589 A1 | 1/2011 | Lee et al. |
| 2011/0018751 A1 | 1/2011 | Lee et al. |
| 2011/0074614 A1 | 3/2011 | Ogawa |
| 2011/0109369 A1 | 5/2011 | Benzer |
| 2011/0210775 A1 | 9/2011 | Malik et al. |
| 2011/0254669 A1 | 10/2011 | Dixit et al. |
| 2011/0309962 A1 | 12/2011 | Hernes et al. |
| 2012/0044004 A1 | 2/2012 | Payne et al. |
| 2012/0119788 A1 | 5/2012 | Turner et al. |
| 2012/0206182 A1 | 8/2012 | Dally |
| 2012/0212362 A1 | 8/2012 | Ebata et al. |
| 2012/0218133 A1 * | 8/2012 | Thirunakkarasu et al. ... 341/141 |
| 2012/0274362 A1 | 11/2012 | Doris et al. |
| 2013/0009796 A1 | 1/2013 | Sakiyama et al. |
| 2013/0015990 A1 | 1/2013 | Payne et al. |
| 2013/0021078 A1 | 1/2013 | Elkin et al. |
| 2013/0033290 A1 | 2/2013 | King |
| 2013/0038365 A1 | 2/2013 | Gao et al. |
| 2013/0099948 A1 | 4/2013 | Dedic et al. |
| 2013/0120179 A1 | 5/2013 | Dedic et al. |
| 2013/0127648 A1 | 5/2013 | Dedic et al. |
| 2013/0127649 A1 | 5/2013 | Dedic et al. |
| 2013/0147647 A1 | 6/2013 | Dedic et al. |
| 2013/0162314 A1 | 6/2013 | Oh |
| 2013/0187805 A1 | 7/2013 | Garrity |
| 2013/0229220 A1 | 9/2013 | Bardsley et al. |
| 2013/0235669 A1 | 9/2013 | Maglione et al. |
| 2013/0257483 A1 | 10/2013 | Bulzacchelli |
| 2013/0314126 A1 | 11/2013 | Garrity |
| 2013/0321059 A1 | 12/2013 | Allen et al. |
| 2014/0070847 A1 | 3/2014 | Elkins et al. |
| 2014/0085121 A1 | 3/2014 | Ebata et al. |
| 2014/0125393 A1 | 5/2014 | Elkins et al. |
| 2014/0132303 A1 | 5/2014 | Segan et al. |

* cited by examiner

APPARATUS AND METHOD FOR REDUCING SAMPLING CIRCUIT TIMING MISMATCH

PRIORITY DATA

This application claims priority to Provisional Patent Application Ser. No. 61/774,432, filed Mar. 7, 2013, which is hereby incorporated by reference in its entirety.

TECHNICAL FIELD OF THE DISCLOSURE

The present disclosure relates generally to sampling circuitry and, more particularly, an apparatus, a system, circuitry, and an associated method, for generating sampling clock signals having reduced timing mismatch.

BACKGROUND

Analog-to-digital converters (ADCs) utilize sampling circuitry that samples an analog input signal at points in time and, then, converts the samples to digital values to create a digital signal. The use of ADCs is common in applications that involve receiving an input signal or input data represented by an analog signal, and then operate to convert the analog signal to a digital signal for further processing in a digital form. In order to convert an analog input signal accurately, the sampling of the input signal performed by the sampling circuitry should be accomplished so that it provides samples to the converter, which represent an analog input signal with as much precision as feasible. As the frequency of an analog input signal (Fin) to be converted increases, the necessary frequency of sampling also increases. As the number of the types of applications in which ADCs are used has increased, there has also been an increase in the need for ADCs capable of operation at increasingly higher speeds of operation.

Time interleaved ADCs, which utilize multiple channels to process an analog input signal on a time interleaved basis, are a type of ADC that has been developed for high-speed applications, high-speed implementations, etc. Interleaving can also lower the power consumption for a given resolution. This is because, as the sampling rate of single-channel ADCs approaches the limits of the technology used, the speed/power trade-off of the single-channel ADCs becomes nonlinear: making interleaving an attractive alternative. If a sufficient number of ADC channels are interleaved, then each bears a linear speed/power trade-off and, hence, reaches an optimum framework. The overhead associated with interleaving should also be taken into account in assessing the overall performance of any system. Additionally, for resolutions of roughly 8 bits and above, the mismatches among the channels, for example timing mismatches between the samples on each of the interleaved channels, should be removed. This may be done, for example, via foreground or background calibration.

Time interleaved ADCs effectively provide a speed advantage in the sampling rate of digital to analog conversion over single channel ADCs, since the conversion rate increases proportionally with the number of channels. In a time interleaved ADC, each channel is able to sample the analog input signal in turn. With N Channels operating in parallel, the sampling rate increases by the factor N over that of a single channel ADC. During a time in which a sample is being taken from one channel, samples from the other channels may be processed. The time interleaved ADCs, therefore, generate digital code words at higher rates than a single channel system. However, a drawback of time interleaved ADCs is that errors can arise because of mismatches between the different channels. Interleaved technology is sensitive to timing mismatches between the channels.

Hence, in addition to raising the conversion speed, interleaving also reduces the metastability rate making an ADC more stable. Since each channel is given a longer time for conversion, the probability of metastability drops exponentially. In a general sense, the performance of interleaved ADCs is typically limited by mismatches among the channels. Gain, offset, and timing mismatches heavily impact the overall signal-to-(noise+distortion) ratio (SNDR) at resolutions of 8 bits or higher. Often times, the timing mismatch is the most difficult to calibrate because it does not easily lend itself to detection or correction.

In a typical time interleaved sampling ADC, sampling signals are used to control the timing of sampling on each of the interleaved channels of the ADC. A track and hold circuit can be used to track (and then take) a sample of the analog input signal from a channel when the sampling signal changes from one state to another: triggering a switch to hold a sample of the analog input signal. Any mismatches between the switches and any timing mismatches between the edges of the sampling signals cause the sequence of interleaved samples from the interleaved channels to be non-uniformly spaced in time. The non-uniform spacing of the samples results in the appearance of undesired spectral components in the output sequence of the sampling system. These spectral components typically produce images of the desired sampled signal and, frequently, occur at undesired locations in the output spectrum. For example, in a simple two-way interleaved system, timing mismatches in the sample clocks can result in images of the desired signal appearing at Fs/2 +/−Fin, where Fs is the sampling frequency of the system and Fin is the frequency of the input signal to the system. The magnitudes of the images are proportional to the time difference between sampling channels, and also proportional to the frequency of the input signal. These errors degrade the maximum achievable spurious-free dynamic range (SFDR) of the sampling system, especially at higher input frequencies.

Reducing the effects of the spectral artifacts caused by timing mismatch is costly. Large digital filters, which consume significant power, can be used. Alternately, lower-power analog circuits can be used to "trim" the timing errors to a small value. However, in either case, the degree to which the errors can be reduced below an acceptable level and maintained at the acceptable level [despite ambient changes in supply, temperature, die stress, etc.,] can depend on how small the errors are initially. Small initial errors tend to remain small, while large initial errors can be reduced by trimming, but tend to drift significantly as ambient changes occur.

Because timing errors are so difficult to remove, systems often utilize some form of randomization of the sampling networks by using additional networks. This does not remove the impact of the timing errors. The randomization simply distributes the errors more randomly in time, rather than in a fixed pattern. This tends to spread the errors into the noise floor of the system. This action increases the noise floor of the system and, further, degrades the maximum signal-to-noise ratio (SNR) that the sampling system can achieve. Minimizing the timing errors, therefore, maximizes the potential signal-to-noise ratio (SNR) that the system can achieve. This is true even when randomization is also used. A system with a small initial timing error provides an advantage in any time interleaved ADC system. Therefore, it would be desirable to have a solution that minimized the timing mismatch in a time interleaved ADC that required reduced complexity to implement, that was relatively simple to implement, and that could be used by itself or in combination with other techniques.

Overview

The present disclosure relates generally to an apparatus, a system, circuitry, and a method for generating sampling signals for controlling a sampling system. In an example embodiment, the method, system, and apparatus may comprise circuitry that generates outputs as sampling clocks for a time interleaved sampling circuit having multiple interleaved sampling channels. The circuitry may be implemented such that common circuitry is shared between the sampling clock circuitry of each of the multiple interleaved channels. Utilization of the common circuitry allows uniform control of the timing relationship between the sampling clocks relative to one another. Such an approach can reduce the timing skew between the sampling clocks. In example implementations of the embodiments, the multiple interleaved sampling channels may comprise the interleaved sampling channels of an analog-to-digital converter (ADC) circuit.

In one embodiment, a circuit for receiving a plurality of input signals including an input clock signal, and generating a plurality of sampling clocks, is provided. The circuit comprises first circuitry configured to selectively set each sampling clock of the plurality of sampling clocks to a first output state, wherein a selected sampling clock of the plurality of sampling clocks is set to the first output state when a selected input of the plurality of input signals is set to a first input state. The circuit also comprises second circuitry configured to transition each of the plurality of sampling clocks to a second output state, through a common path, wherein the selected sampling clock is transitioned from the first output state to the second output state through the common path in response to a transition of the input clock signal from a first to a second clock state.

In another embodiment, the circuit may comprise boost circuitry to generate boosted outputs as sampling clocks for a time interleaved sampling circuit. The boosted sampling clocks provide a higher signal level for turning on the switches that are driven by the sampling clock outputs. The circuitry can be implemented such that common circuitry may be shared between the sampling clock circuitry of each of the multiple interleaved channels. Utilization of the common circuitry can allow for a uniform control of the timing relationship between the boosted sampling clocks.

In yet another embodiment, the circuit may include a sampling circuit that includes a plurality of sampling channels each coupled to an output of the first circuitry corresponding to one of the plurality of sampling clocks. The sampling circuit may be configured to generate a sample from a selected channel of the plurality of channels when the selected sampling clock is transitioned to the second output state from the first output state.

In another example embodiment, the method, system, and apparatus comprises circuitry to generate outputs as sampling clocks for an time interleaved sampling circuit that includes a structure that minimizes timing skew between the sampling clocks by utilizing a common clock signal that controls pull-up/hold-down circuitry that may be shared between the sampling clock circuitry of each of the multiple interleaved channels. Utilization of the common pull-up/hold-down circuitry allows control of the timing relationship between the edges of the sampling clocks of the multiple interleaved channels relative to one another to minimize clock skew. In this implementation of the pull-up/hold-down circuitry, the sampling clocks may be boosted.

In other example embodiments, the method, system, and apparatus comprises circuitry to generate outputs as sampling clocks for an time interleaved sampling circuit that may include structure that minimizes timing skew between the sampling clocks by utilizing a common clock signal. The common clock signal controls pull-up/hold-down circuitry and pull-down circuitry that may be shared between the sampling clock circuitry of each of the multiple interleaved channels. Utilization of the common pull-up/hold-down circuitry and pull-down circuitry allows control of the timing relationship between the edges of the sampling clocks of the multiple interleaved channels (relative to one another) to minimize clock skew. In an example implementation of the embodiment of the pull-up/hold-down circuitry and pull-down circuitry, the sampling clocks may be boosted.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

The present disclosure relates generally to an apparatus, a system, and method for generating sampling signals for a controlling a sampling system. More particularly, the present apparatus, system, and method provides embodiments for generating sampling clocks for interleaved sampling circuits that minimize mismatch and timing skew between the sampling clocks of the multiple channels of an interleaved sampling circuit.

Figure 1A:
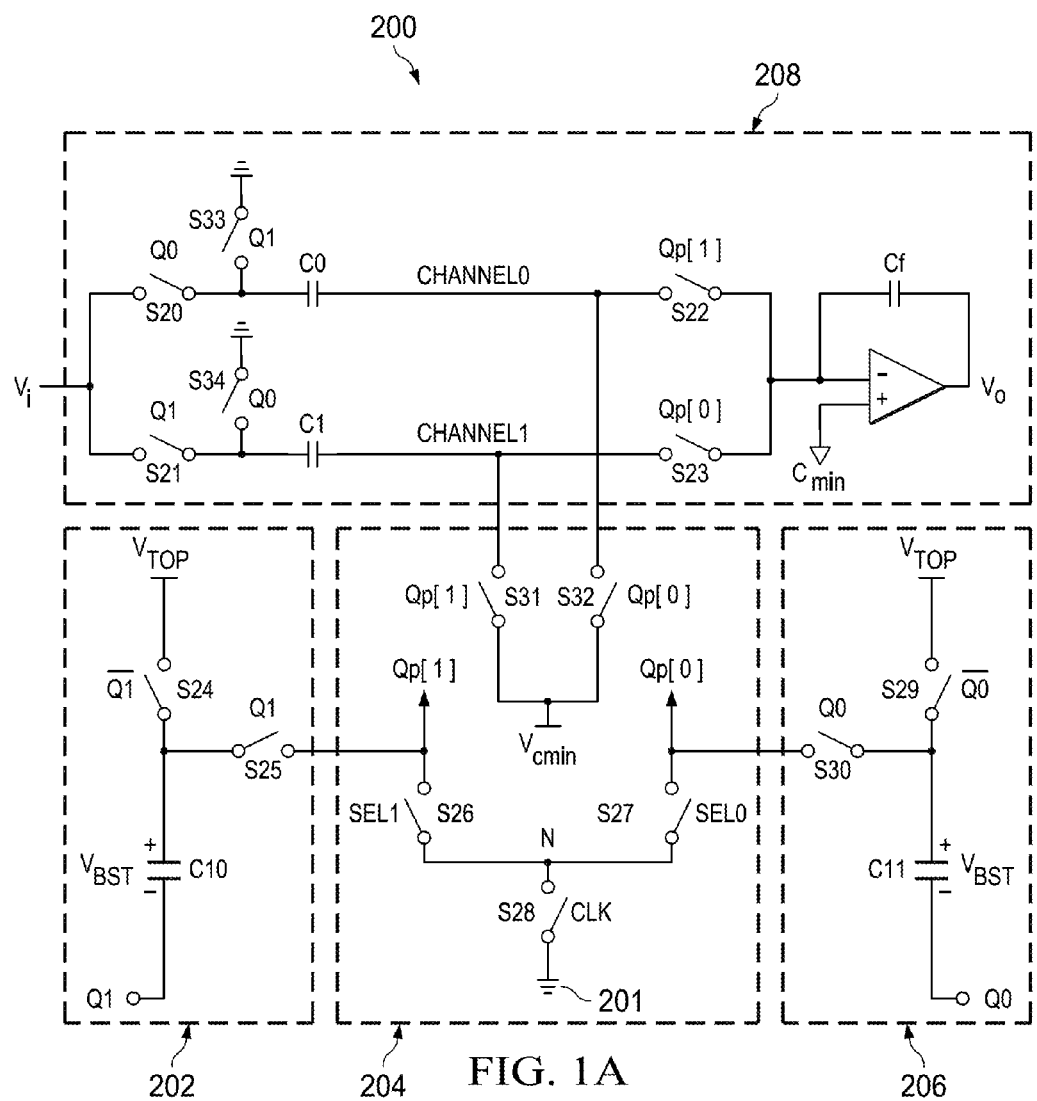
FIG. 1A illustrates an example switch-level illustration of an embodiment of the disclosure.

Referring now to FIG. 1A, therein is a switch-level illustration of an example embodiment of the disclosure that is configured for generating sampling clocks in an interleaved analog-to-digital converter (ADC). FIG. 1A illustrates ADC sampling circuitry 200 that comprises interleaved ADC channel circuitry 208, circuitry for generating sampling clocks that comprises pull-down circuitry 204, voltage circuitry 202, and voltage circuitry 206. The ADC circuitry 208 receives an analog input signal at input Vi and generates a sample of the analog input signal at output Vo. The sample output at Vo may then be converted to a digital value for further processing.

The switch-level implementation of FIG. 1A illustrates switches S20-S34 that are shown within the various portions of sampling circuitry 200. Each of the individual switches S20-S34 in the example embodiment of FIG. 1A represent a logic level switch that is configured to couple two nodes together. Each switch is off when a switch input signal is at a low state, or low logic state, and each switch closes a connection when a switch input signal, which is indicated by the respective signal name label on the switch, moves to a high signal level or high logic state. For example, when signal Q0 moves to high, switch S20, which is configured to couple Vi to C0, activates and closes a connection between Vi and C0. While FIG. 1A illustrates the example embodiment as a particular logic switch-level implementation it should be noted that the switch functions of FIG. 1A may be implemented in many different configurations of switching circuitry. For example, in other implementations, one or more of the switches may be activated by a low logic state rather than a high logic state on the switch input. Additionally, the circuitry of the various embodiments of the disclosure may be implemented with different types of technology using differing components. The circuitry may comprise, for example, MOSFET implemented switching logic using NMOS or PMOS logic. Also, while the embodiment of FIG. 1A illustrates particular input signals and output signals and timing relations between those signals, it should be noted that the advantages of the embodiment may be realized by using different arrangements of input and output signals, having differing logic states and differing timing relations between those signals. Additionally, it should be noted that while FIG. 1A illustrates two interleaved channels, the implementation of FIG. 1A may be extended to generate sampling clocks for any number of interleaved channels greater than two.

In the embodiment of FIG. 1A, the operation of sampling circuitry 200 may be controlled by input signals received at inputs SEL0, SEL1, Q0, Q1, and CLK. The logic states and timing of these input signals relative to one another control the generation of the sampling signals at sampling clock outputs Qp[0] and Qp[1] that trigger sampling on channel 0 and channel 1, respectively. Sampling clock outputs Qp[0] and Qp[1], which are generated in pull-down circuitry 204 plus pull-up boost voltage circuitry 202, 206, control when samples are taken on channel 0 and channel 1, respectively, of an analog signal input at input Vi. The embodiment provides an advantage in that pull-down circuitry 204 (functioning in conjunction with voltage circuitry 202 and 206) allows control of the timing of signals at outputs Qp[0] and Qp[1] through the common node N and common switch S28 using the CLK input signal. Control of the timing of signals at outputs Qp[0] and Qp[1] through the common node N, common switch S28 and the switches S26 and S27 minimizes clock skew effects and timing mismatch effects on the ADC. This advantage may be extended to generate sampling clocks for any number of interleaved channels greater than two by adding a switch to the plurality of switches that comprises switches S26 and S27 for each additional output at which a sampling clock is generated, to couple the additional output to node N.

Figure 1B:
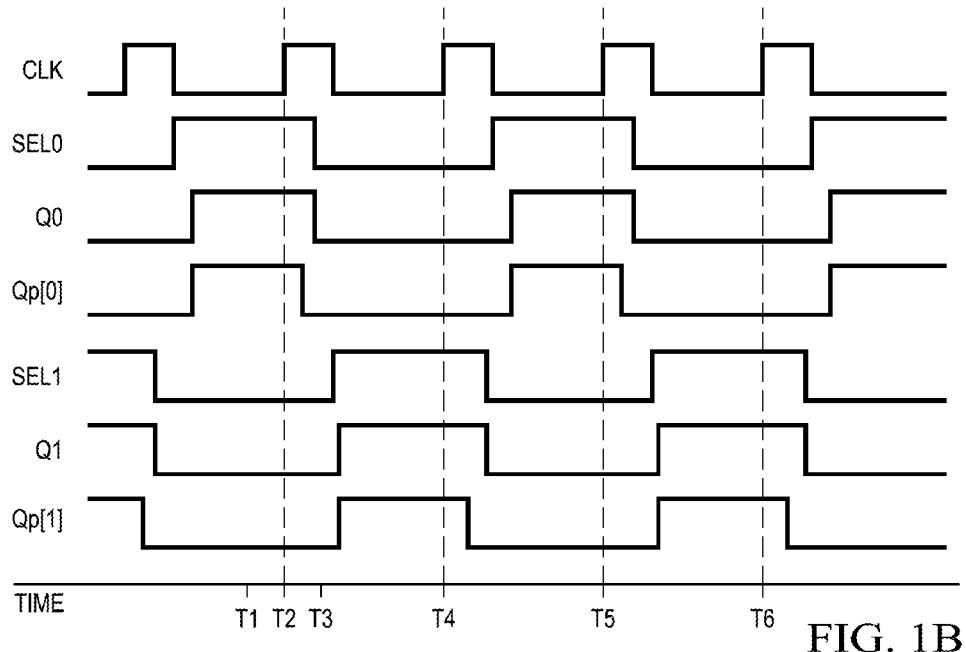
FIG. 1B illustrates example timing waveforms for the embodiment of FIG. 1A.

Referring now to FIG. 1B, therein are shown example timing waveforms for the input signals of the timing circuitry of the embodiment of FIG. 1A. FIG. 1B illustrates example timing waveforms for the CLK, SEL0, Qp[0], Q0, SEL1, Q1 and Qp[1] signals. Inputs SEL0 and SEL1 are input to pull-down circuitry 204 and control the overall system timing for sampling. In the embodiment of FIG. 1A, SEL0, Q0, SEL1 and Q1 are not input directly to interleaved sampling channel circuitry 208, but are input to pull-down circuitry 204 and booster circuitry 202 and 206. Pull-down circuitry 204 and voltage circuitry 202 and 206 then generate outputs Qp[0] and Qp[1] to trigger sampling in interleaved sampling circuitry 208. Input Q0 may be generated based on SEL0 and timed to have a falling edge that follows Qp[0]'s falling edge. Input Q1 may be generated based on SEL1 and timed to have a falling edge that follows Q[1]'s falling edge. The CLK signal may then be input to pull-down circuitry 204 and used control the relative timing of the sampling driven by Qp[0] and Qp[1]. In the embodiment, FIG. 1B shows, SEL0 and SEL1 as periodic waveforms of opposite polarity and the CLK signal may be input as a periodic pulse that may be timed so that the CLK high logic state encompasses the falling edges of SEL0 and SEL1.

Referring to FIGS. 1A and 1B, for explanation, when SEL0 is high and SEL1 is low at time T1, Q1 and SEL1 being in the low logic state will cause switches S25 and S26 to be open and Qp[1] to remain in its previous state, which will be a low logic state. Also at time T1 input Q1 will be low and Vi will be switched off from interleaved channel 1 by S21 being open, and inputs SEL0 and Q0 high will cause S30 and S27 to be closed and S29 to be open. Prior to this, when input Q0 was previously low, S29 was closed and VTOP was connected to the top plate of the capacitor C11. When Q0 goes high, S29 opens, sampling VTOP onto the top plate of capacitor C11. Thus, the voltage sampled onto C11, VBST, will be equal to the difference between VTOP and the actual voltage level of the low level logic signal Q0. When Q0 goes high S30 closes and Qp[0] will be in a high logic state at an actual voltage level equal to the voltage level of high logic state input Q0 plus VBST. QP[0] going to the high logic state switches S32 on and connects CHANNEL 0 to the voltage Vcmin. Qp[1] being low will keep S22 open and Q0 being high will close S20 allowing capacitor C0 to track the input signal Vi. The CLK input may be timed to go to a high state when SEL0 is still high as shown in FIG. 1B at time T2. When CLK moves to high at T2 with SEL0 high, switch S28 closes and pulls Qp[0] to the voltage level of node 201, which, for example, may be held at ground, through S27. Qp[0] going low turns off switch S32 and triggers a sample of the value of Vin to be taken on CHANNEL 0 at the time when Qp[0] moves to low and switches off S32. When SEL0 subsequently moves to low and SEL1 moves to high at time T3, switch S20 will open and switches S22 and S33 will close allowing a sample of an analog input signal at input Vi to be output at output Vo of interleaved ADC channel circuitry 208. During the time prior to T3 while Q1 is in the low state, S24 is closed and VTOP is connected to the top plate of the capacitor C10. This charges C10 to a voltage equal to the voltage difference between the input Q1 low state and VTOP, and is equal to VBST. When Q1 goes high after time T3, S24 opens, S25 closes and VTOP may be sampled onto the top plate of capacitor C10.

When SEL0 moves to low at T3, SEL1 moves to high and the previously described process for generating the sampling clock at Qp[0] for interleaved sampling CHANNEL 0 happens similarly for generating the sampling clock at Qp[1] for interleaved sampling CHANNEL 1, with the SEL1, Q1 and Qp[1] signals substituted for SEL0, Q0 and Qp[0], respectively, capacitor C10 substituted for capacitor C11, and the switches S21, S23, S24, S25, S26 and S34 substituted for switches S20, S22, S29, S30, S27 and S33, respectively, in the described process. Similarly, as on CHANNEL 0 when Qp[0] was pulled low by CLK going high at T2, a sample on CHANNEL 1 will be taken when Qp[1] is pulled low from the voltage level of the high logic state input Q1 plus VBST through S26 and S28 by the CLK signal going high at T4 while SEL1 is high. In the two channel embodiment of FIG.

1A, the sampling clocks Qp[0] and Qp[1] continue to alternately trigger sampling at CHANNEL 0 and CHANNEL 1 on the subsequent transitions of the CLK input from the low state to the high state. For example, in FIG. 1B, a sample will triggered by the CLK input transitioning from the low state to the high state at time T5 at CHANNEL 0 and a sample will be generated by the CLK input transitioning from the low state to the high state at CHANNEL 1 at time T6. In an embodiment of the circuitry of FIG. 1A with a number of interleaved channels greater than two, for example, a plurality of N interleaved sampling channels, the sampling of the analog signal would be alternately taken, separately on each of the N sampling channels. This may be done by generating appropriately timed input signals on inputs SEL[0] . . . SEL[N] and Q0 . . . QN so that the inputs triggering the sampling on the channels are alternately set one at a time to the high state when the CLK input transitions from the low to the high state.

The sampling clocks Qp[0] and Qp[1] for the interleaved channels in the embodiment of FIG. 1A, therefore, are synchronized to the CLK signal's rising edge by the common node N being pulled to the state of node 201 through a common path created by the one common switch S28. This reduces the effect of timing mismatch between SEL0 and SEL1, or other sampling clock signals that would otherwise be used as sampling clocks to sample the channels. In an embodiment with a plurality of interleaved sampling channels greater than two, the use of the common path would synchronize each of the sampling clocks Qp[0] . . . Qp[N] in the same manner. The embodiment provides an advantage in that switch S28 may be implemented using a single transistor, thereby, minimizing the difference in the propagation delay paths from the rising edge of the CLK input to the falling edge of Qp[0] and from the rising edge of CLK to the falling edge of Qp[1] since both signals are pulled down to low through the same path through switch S28 If separate logic gates each comprised of separate transistors were used for setting Qp[0] and Qp[1] low, no matter how the logic gates are created, due to manufacturing variances, there would be a difference in the propagation delay through each of the gates from the rising edge of CLK to the falling edge of Qp[0] and from the rising edge of CLK to the falling edge of Qp[1]. Uniform spacing of the falling edges of the sampling clocks, Q1p[0] and Q1[1], that is, the edges that control the turn-off instant of the sample switches, is important for preserving uniformly-spaced input samples. Uniform spacing of the rising edges may not be as critical in this embodiment.

Additionally, the embodiment of FIG. 1A provides the added advantage of having the voltage circuitry 202 and 206 boosting the Qp[0] and Qp[1] signals to drive the switches, S23, S32 and S22, S31, switched by Qp[0] and Qp[1], respectively, with a boosted voltage fully and cleanly on.

Figure 2:
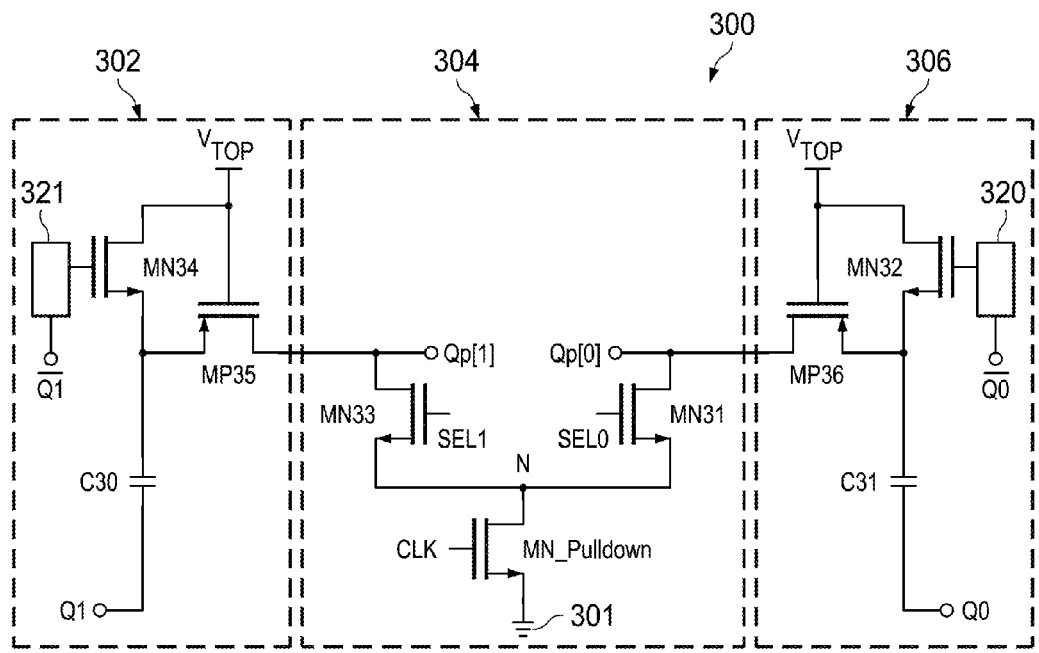
FIG. 2 illustrates an example implementation of the pull-down circuitry of the embodiment of FIG. 1.

Referring now to FIG. 2, therein is shown transistor level circuitry that is an example implementation of boosted voltage circuitry 202 and 206, and pull-down circuitry 204 of FIG. 1A. The implementation of FIG. 2 comprises booster circuitry 302 and 306, and pull-down circuitry 304, which correlates with boosted voltage circuitry 202 and 206, and pull-down circuitry 204, respectively, of FIG. 1A having the same functions. The circuitry of the implementation of FIG. 2 receives the inputs SEL0, SEL1, Q0, Q1 and CLK, and generates outputs Qp[0] and Qp[1] as was described for the embodiment of FIG. 1A and FIG. 1B. Pull-down circuitry 304 includes MOS transistors MN_Pulldown, MN31 and MN33. MN31 and MN33 are each configured to couple a corresponding circuit output, Qp[0] and QP[1], respectively, to the common node N. The drain terminal of MN33 may be connected to the Qp[1] sampling clock output and the drain of MN31 may be connected to the Qp[0] sampling clock output. The source terminals of both MN31 and MN33 are connected to the drain terminal of MN-pull-down at common node N. The source terminal of MN_Pulldown may be connected to the node 301, coupling common node N to node 301 through MN_Pulldown. In the embodiment, Node 301 may be held at a voltage level of 0 or ground .SEL0, SEL1, and CLK are input to the gate terminals of MN31, MN33 and MN_Pulldown, respectively. A gate control circuit 321 in booster circuitry 302 turns on MN34 when Q1 is low. This charges capacitor C30 between the voltage of Q1 (which is the low logic state) and VTOP. Gate control circuitry 320 in booster circuitry 306 similarly turns on MN32 when Q0 is low. This charges capacitor C31 between the voltage of Q0 (which is the low logic state) and VTOP.

One purpose of booster circuitry 302 is to turn on the sampling switches driven by Qp[0] and Qp[1] using a large gate-to-source voltage (VGS), even when the supply voltage is limited or small, compared to the threshold voltage of the transistors used to sample the input signal. It should be noted that in many low voltage CMOS sampling circuits, the use of clock boosting is important for turning switches on.

Figure 3A:
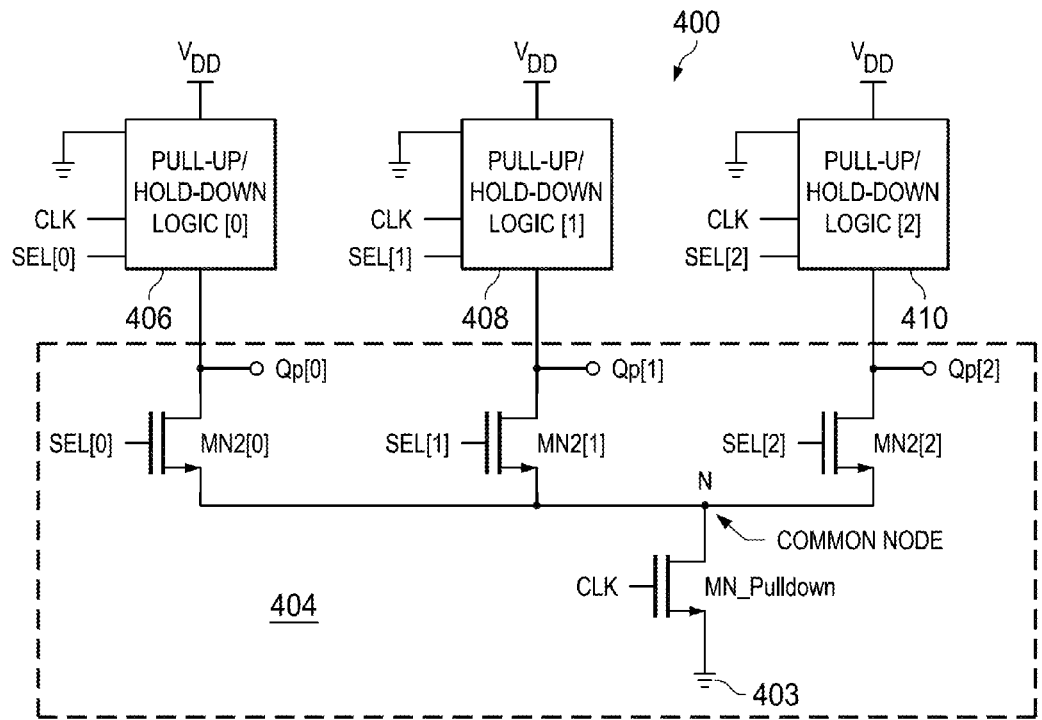
FIG. 3A illustrates sampling circuitry in accordance with another embodiment of the disclosure.
Figure 3B:
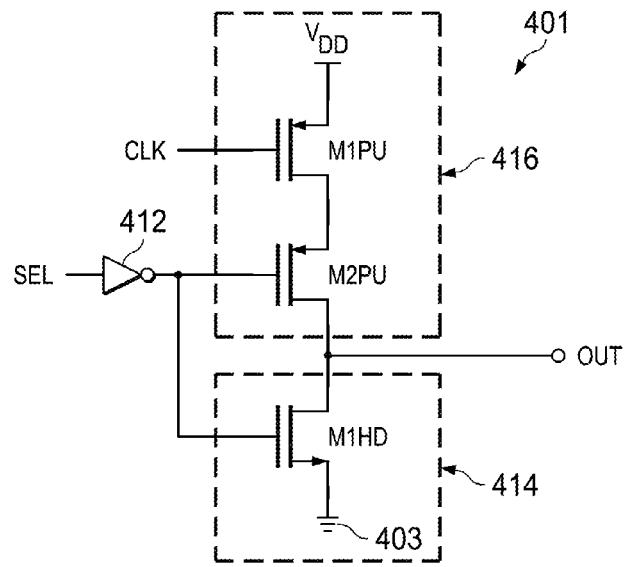
FIG. 3B illustrates an example implementation of pull-up/hold-down circuitry of the embodiment of FIG. 3A.

When the circuitry of FIG. 2 is provided the same inputs on SEL0, SEL1, Q0, Q1, and CLK, as was described in relation to the switch-level implementation of FIG. 1A, the circuitry 300 of FIG. 3 provides output signal waveforms on Qp[0] and Qp[1] having the same relationships as shown in FIG. 1B. While FIG. 2 illustrates a particular transistor level implementation of portions of FIG. 1A, using NMOS transistors it should be noted that many different transistor and component level implementations having the same function may be readily configured without departing from the broad scope of the present disclosure. For example, PMOS transistors may be used to create a implementation of the embodiment Referring now to FIG. 3A, therein is shown sampling circuitry 400 according to a further embodiment of the disclosure. The embodiment of FIG. 3A comprises pull-down logic 404, and pull-up/hold-down logic 406, 408, and 410. The embodiment of FIG. 3A is shown configured to generate sampling clocks for a 3-channel interleaved ADC, but the circuitry may be reduced or extended to operate with any number of sampling channels. Each pull-up/hold-down logic section 406, 408, 410 operates with one of the 3 sampling channels. In the embodiment of FIG. 3A, pull-up/hold-down logic sections 406, 408, 410 may each be implemented as the example transistor implementation of the embodiment shown in FIG. 3B (i.e., pull-up/hold-down logic 401).

Referring to FIG. 3B, pull-up/hold-down logic 401 includes inverter 412 and MOS transistors M1PU, M2PU and M1HD. Pull-up section 416 comprises M1PU and M2PU which are configured to couple VDD to the output OUT. The pull-up section 416 pulls the output, OUT, up to VDD through M1PU and M1PU when the CLK input is low and the SEL input is high. The hold-down section 414 comprises transistor M1HD that is configured to couple the output OUT to node 403. When SEL is low, M1HD is on and holds OUT at the low state of node 403. The pull-up/hold-down logic, 406, 408, and 410, for each channel according to the embodiment of FIG. 3A, may be implemented by connecting the appropriate sampling input, SEL[0], SEL[1] or SEL[2], for each channel to the SEL input of circuitry implemented, separately for each channel, as pull-up/hold-down logic 401, connecting the CLK input of each pull-up/hold-down logic 406, 408, and 410 to the CLK input of the circuitry implemented as pull-up/hold-down logic 401 and, connecting the OUT terminal of each pull-up/hold-down logic 406, 408, and 410 implemented as pull-up/hold-down logic 401, for each channel, to the appropriate output of Qp[0], Qp[1] or Qp[2]. The pull-up/hold-down logic circuits, 406, 408, and 410 generate the appropriate sampling clock signals at Qp[0] Qp[1] or Qp[2], respectively, for triggering sampling, in turn, on three interleaved channels in conjunction with pull-down circuitry 404.

Referring again to FIG. 3A, pull-down circuitry 404 includes MOS transistors MN_Pulldown, MN2[0], MN2[1] and MN2[2]. Pull-down circuitry 404 functions similarly to pull-down circuitry 204 and pull-down circuitry 304 of FIGS. 1A and 2, with the exception that pull-down circuitry 404 in the embodiment of FIG. 3A may be configured to generate output sampling clock signals, Qp[0], Qp[1] and Qp[2], for sampling three channels rather than two channels. For the embodiment of the sampling circuitry 400 of FIG. 3A, an additional cycle of the CLK signal may be added for the third channel. Each signal Qp[0], Qp[1] or Qp[2] may be cycled through, in turn or randomly, to be set high by the appropriate pull-up/hold-down logic section 406, 408, or 410, respectively, and then pulled down by pull-down circuitry 404 through application of the input signals SEL0, SEL1, SEL2, and CLK to circuitry 400. Each sampling clock Qp[n] can be independently set high by its respective pull-up network. In this state, the corresponding select line would be at a high state, while CLK is at a low state. As an example, Qp[0] would be set high when SEL[0] is high and CLK is low. All other Qp[n] channels would be low in this case, with their respective SEL[n] inputs set to the low state.

At the sampling time, when the CLK input transitions from the low state to the high state, pull-down circuitry 404 may be used to pull-down Qp[0], Qp[1] or Qp[2] through MN2[0], MN[2] or MN[1], respectively, to the low state of node 403 via common node N through MN_Pulldown by the CLK signal rising high and turning on MN_Pulldown. For example, when SEL[0] is in a high state and the CLK input transitions from the low state to the high state, Qp[0] will be pulled down through MN_Pulldown and MN2[0]. The instant at which Qp[0] starts to fall is determined primarily by the turn-on characteristics of MN_Pulldown responding to the input signal CLK transitioning from the low state to the high state, and to a much smaller extent, by the threshold voltage of MN2[0]. In a similar fashion, when the appropriate SEL[n] input is high, each of the other sampling clocks, Qp[n], will start to fall at a time determined primarily by MN_Pulldown responding to the CLK signal transitioning from the low state to the high state. The time will also be determined to a much smaller extent by the threshold voltages of the respective MN2[n] transistor. One advantage of this embodiment is that the start of the high-to-low transition of every sampling clock output Qp[n] in this disclosure is controlled primarily by one single transistor. The secondary effects of the pass-gate transistors, as illustrated by MN2[n], have a much reduced effect on the start of the falling edge.

Figure 4A:
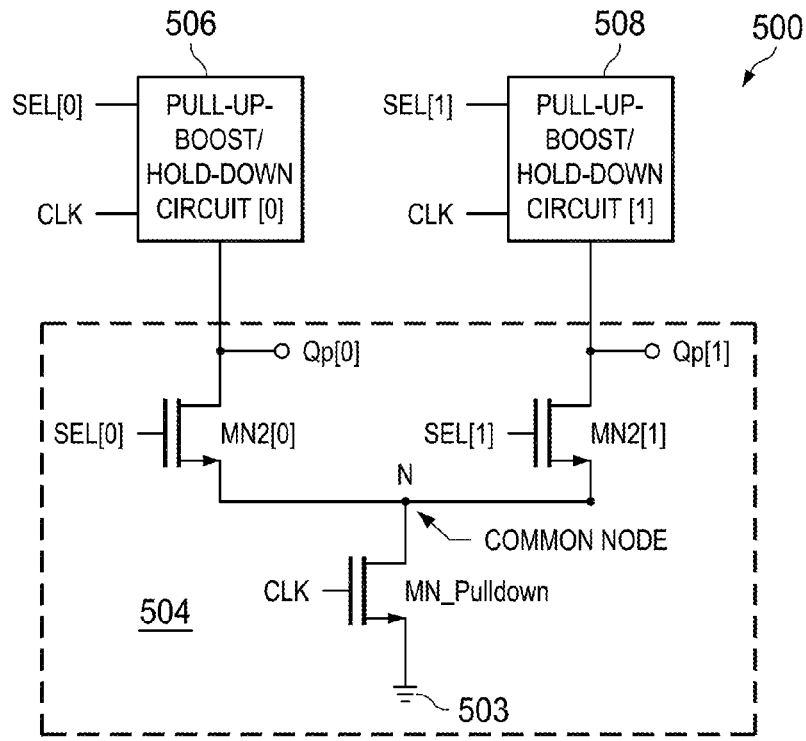
FIG. 4A illustrates sampling circuitry in accordance with a further embodiment of the disclosure.

Referring now to FIG. 4A, therein is shown sampling circuitry 500 according to a further embodiment of the disclosure. Sampling circuitry 500 comprises pull-down circuitry 504 and pull-up-boost/hold-down circuitry 506 and 508. The embodiment of FIG. 4A is shown configured to generate sampling clocks for a 2-channel interleaved ADC, but the circuitry may be extended to operate with any number of interleaved channels. Sampling circuitry 500 includes a pull-up-boost/hold-down logic section 506 and 508 for each sampling channel. In the embodiment of FIG. 4A, pull-up-boost/hold-down logic sections 506 and 508 may each be implemented according to the example implementation shown in FIG. 4B.

Figure 4B:
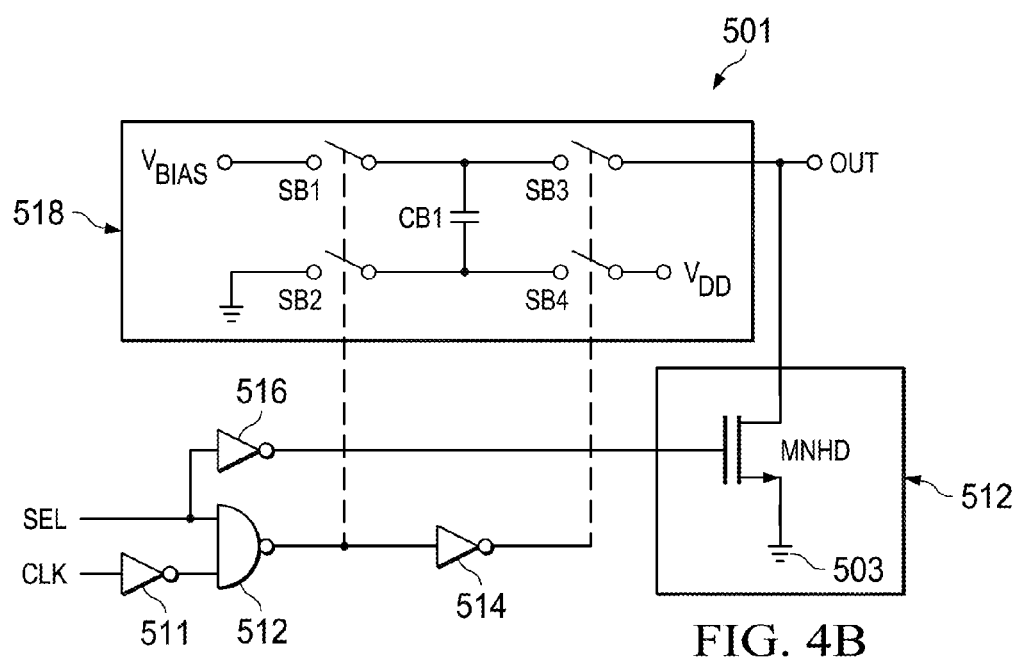
FIG. 4B illustrates an example implementation of pull-up-boost/hold-down circuitry for the embodiment of FIG. 4A.

Referring to FIG. 4B, therein is an example implementation of the pull-up-boost/hold-down circuitry 506 and 508 of the embodiment of FIG. 4A. Pull-up-boost/hold-down circuitry 501 includes NAND gate 512, inverters 511, 514, and 516, MOS transistor MNHD, switches SB1, SB2, SB3, and SB4, and capacitor CB1. Logically, pull-up-boost/hold-down circuitry 501 generates controls for the pull-up-boost circuit 518 such that the voltage on the OUT output may be boosted above the supply voltage Vdd by the voltage Vbias, when SEL is high and CLK is low. When either SEL is low or CLK is high, the pull-up-boost circuit 518 is disconnected from the output, OUT, and instead charges capacitor CB1 to bias voltage VBIAS. One purpose of pull-up boost circuit 518 is to turn on the sampling switches driven by Qp[0] and Qp[1] using a large gate-to-source voltage (VGS) on the OUT output boosted above the supply voltage Vdd by the voltage Vbias. This will drive the sampling switches even when the supply voltage is limited or small, compared to the threshold voltage of the transistors used to sample the input signal. A hold-down circuit 512 comprising MNHD, which is configured to couple the output OUT to node 503, may be operated to hold the output node, OUT, at the low state of node 503 whenever SEL is low and MNHD is on. It should be appreciated that the logic used to create the control signals for the switches SB1-SB4 is shown by example only, and that other, functionally equivalent, methods of generating the control signals for the switches may be used without departing from the scope of the present disclosure.

In the embodiment of FIG. 4A, the pull-up-boost/hold-down logic, 506 and 508, may be implemented by connecting the appropriate sampling input, SEL[0] or SEL[1], for each channel to the SEL input of circuitry implemented similarly to pull-up-boost/hold-down circuit 501 of FIG. 4B in each of pull-up-boost/hold-down circuit portions 506 and 508. The CLK input signal of sampling circuitry 500 then may be connected to the CLK input of each pull-up-boost/hold-down circuit portion 506 and 508 and the sampling output for each channel Qp[0] or Qp[1] may be connected to the appropriate OUT terminal of pull-up-boost/hold-down circuit 506 or 508 implemented as pull-up-boost/hold-down circuit 501. Implemented as such, the pull-up-boost/hold-down circuits, 506 and 508 generate, in conjunction with pull-down circuitry 504, the appropriate signals at sampling clock outputs Qp[0] and Qp[1], respectively, for triggering sampling, in turn, on the interleaved channels.

Referring again to FIG. 4A, pull-down circuitry 504 includes MOS transistors MN_Pulldown, MN2[0] and MN2[1]. Pull-down circuitry 504 functions similarly to pull-down circuitry 204 and pull-down circuitry 304 of FIGS. 1A and 2. For the embodiment of the sampling circuitry 500 of FIG. 4A, each signal Qp[0] and Qp[1] may be cycled in turn to be set to a high state by pull-up-boost/hold-down logic section 506 and 508, respectively, and pull-down circuitry 504 through application of the input signals SEL[0], SEL[1] and CLK to sampling circuitry 500. Each sampling clock Qp[n] may be independently set to the high state by its respective pull-up network. When Qp[n] is In the high state, the corresponding select line SEL[n] would be at a high level, while CLK is at a low level. As an example, Qp[0] would be set high when SEL[0] is high and CLK is low. All other sampling clock outputs Qp[n] would be in the low state with their corresponding SEL[n] input set to the low state.

When the CLK input transitions for a low state to a high state, pull-down circuitry 504 pulls down Qp[0] or Qp[1], respectively, to the low state of node 503 through MN2[0] or MN2[1] via common node N through a common path through MN_Pulldown. For example, when SEL0 is in a high state and CLK transitions from a low state to a high state, it pulls Qp[0] down to a low state through MN_Pulldown and MN2

[0]. The instant at which Qp[0] starts to fall may be determined primarily by the turn-on characteristics of MN_Pulldown responding to the transition of the CLK from the low state to the high state, and to a much smaller extent, by the threshold voltage of MN2[0]. In a similar fashion, when the SEL[1] input is high, Qp[1] will start to fall at a time determined primarily by MN_Pulldown responding to the CLK signal transitioning from the low state to the high state. The time will also be determined to a much smaller extent by the threshold voltages of the MN2[1] transistor. This has the advantage provided by the embodiments of this disclosure in that the start of the high-to-low transition of every sampling clock output Qp[0] or Qp[1]] is controlled primarily by one single transistor MN_Pulldown. The secondary effects of the pass-gate transistors MN2[0] and MN[1] have a much reduced effect on the start of the falling edge.

It should be noted that use of the boost circuits in several of the example embodiments, such as that of FIG. 4A, to turn on sampling switches driven by Qp[0] and Qp[1], using a large gate-to-source voltage (VGS) that is boosted above a reference voltage, for example, the supply voltage Vdd, by a predetermined voltage Vbias, provides the advantage that the sampling switches are driven by a boosted voltage even when the supply voltage is limited or small. When the supply voltage is limited or small compared to the threshold voltage of the transistors used to sample the input signal this assures the sampling switches are driven and on to provide an accurate sample when the sample is taken from each channel.

Figure 5:
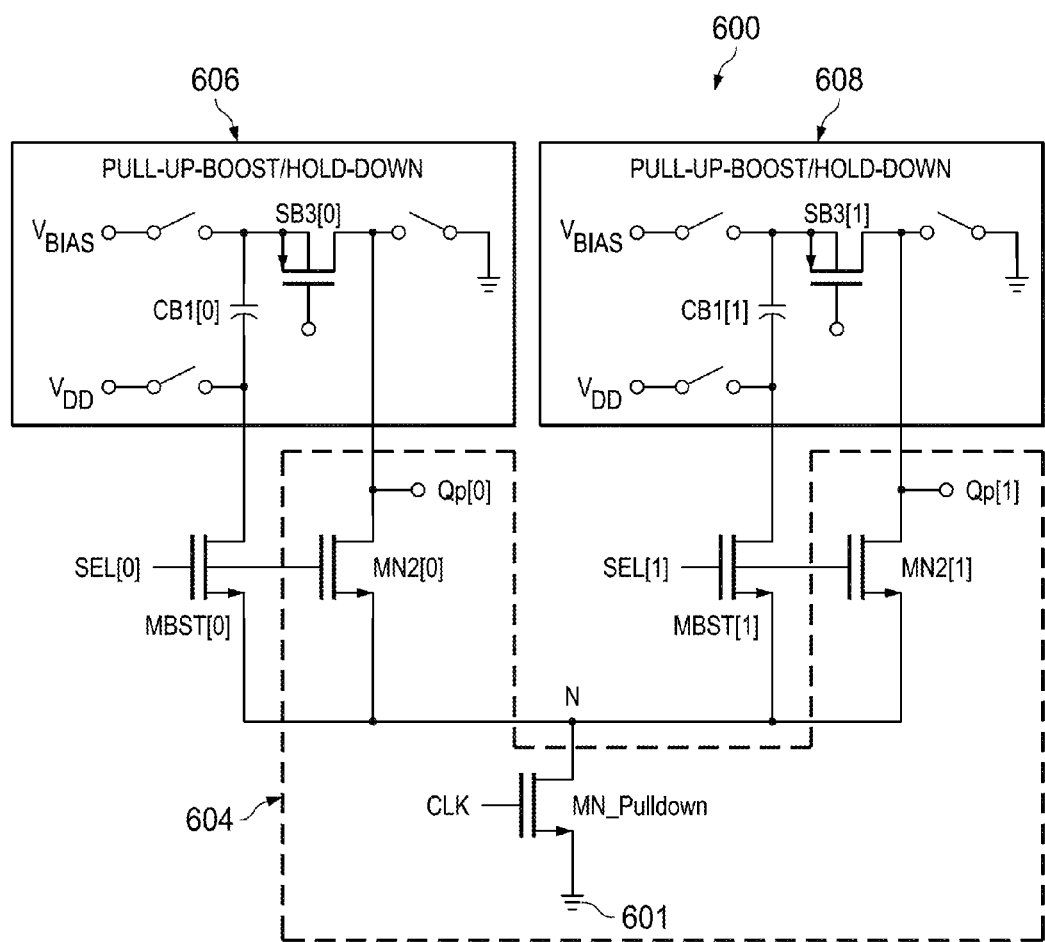
FIG. 5 illustrates an example implementation of pull-up-boost/hold-down and pull-down sampling circuitry in accordance with another embodiment of the disclosure.

Referring now to FIG. 5, therein is shown another example embodiment of the disclosure. FIG. 5 illustrates sampling circuitry 600 that includes pull-down circuitry 604 and pull-up-boost/hold-down circuits 606 and 608. In the embodiment of sampling circuitry 600, pull-up-boost/hold-down circuit 608 includes a boost capacitor CB1[1] and a switch SB3[1] and pull-up-boost/hold-down circuit 606 includes a boost capacitor CB1[0] and a switch SB3[0]. The bottom plate of each boost capacitor CB1[0] and CB1[1] may be connected to a pull-down network that operates in parallel with the pull-down circuit 604. The parallel-pull-down circuit for each channel sampling clock output Qp[n], n=0, 1, of FIG. 5 includes an NMOS transistor MBST[n] having its gate connected to SEL[n] and its source connected to the common pull-down node N. The drain of MBST[n] may be connected to the bottom plate of the boosting capacitor, CB1[n]. This parallel-pull-down configuration ensures that the falling edge of the sample clock Qp[n] begins at a time determined only by the main pull-down transistor, MN_Pulldown. There are two propagation paths between the common node N and each Qp[n]. One directly through MN2[n], which is configured to couple Qp[n] to common node N, and one through MBST[n], the boost capacitor, CB1[n], and finally through the switch SB3[n] in the pull-up-boost/hold-down section 606 or 608. Both paths are activated at the same time by turning on MN_Pulldown with the CLK signal. MN_Pulldown is configured to couple common node N to node 601. Common node N is set to the low state of node 601 when MN_Pulldown is turned on by CLK being in the high state.

Figure 6A:
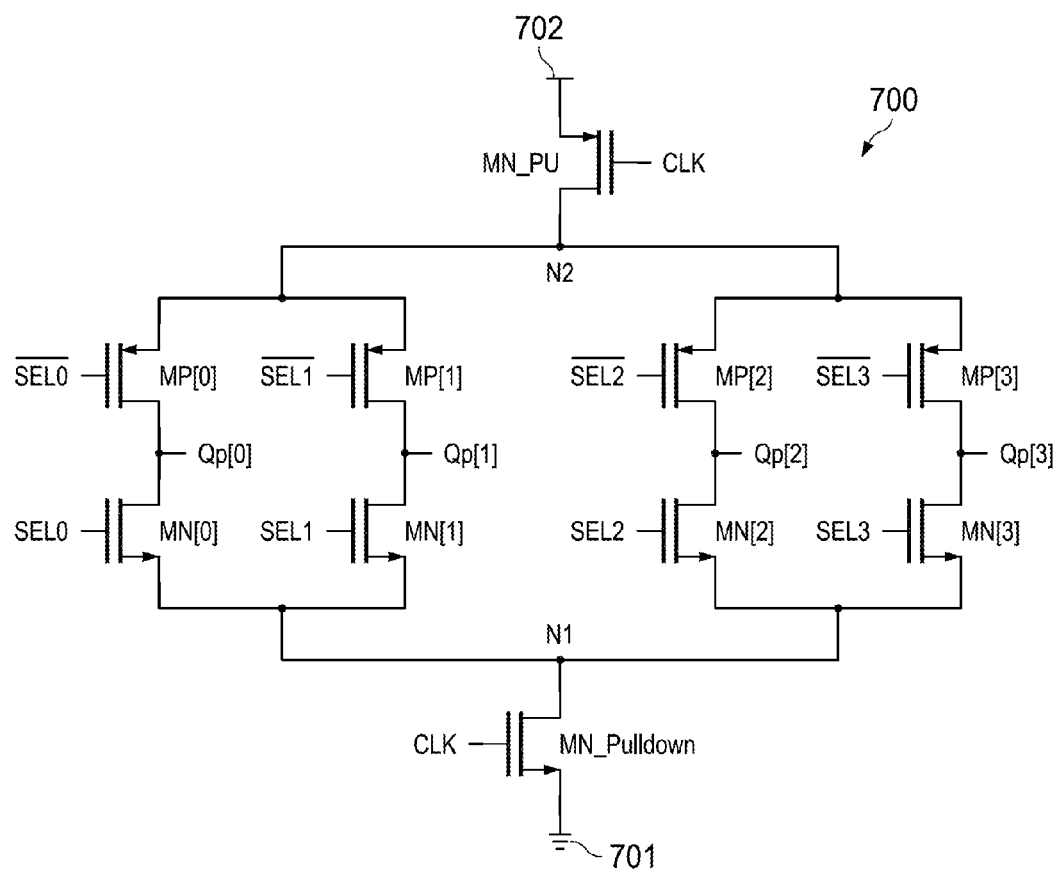
FIG. 6A illustrates an example implementation of pull-up and pull-down sampling circuitry in accordance with a further embodiment of the disclosure.
Figure 6B:
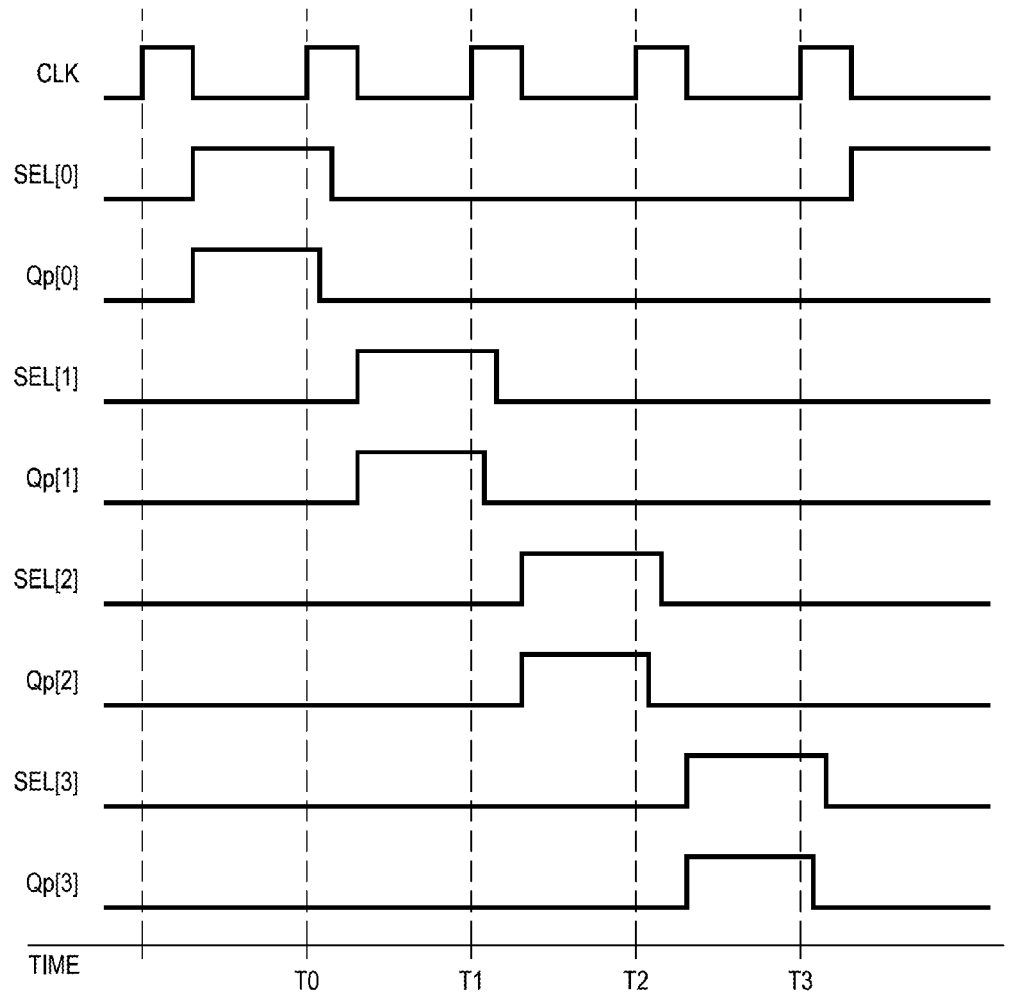
FIG. 6B illustrates example timing waveforms for the embodiment of FIG. 6A.

Referring now to FIGS. 6A and 6B, FIG. 6A illustrates a sampling circuit 700 in accordance with another embodiment of the disclosure and FIG. 6B illustrates example of waveforms that may be used as the input and output signals of sampling circuitry 700. Sampling circuit 700 generates 4 sampling clocks Qp[0]-Qp[3]. In an embodiment, sampling circuit 700 may generate sampling clock signals for a 4-channel interleaved ADC. Sampling circuit 700 comprises MOS transistors MN[0], MN[1], MN[2], MN[3] and MP[0], MP[1], MP[2], MP[3], MN_PU and MN_Pulldown. Input signals SEL0, SEL1, SEL2 and SEL3 are the sampling inputs from which circuit 700 generates the Qp[0], Qp[1], Qp[2] and Qp[3] sampling clock signals for an interleaved channel ADC. Example input waveforms for sampling circuit 700 are shown in FIG. 6B. It can be seen from FIG. 6B that each output of Qp[0], Qp[1], Qp[2], and Qp[3] are each driven to the high state when each of SEL0, SEL1, SEL2, and SEL3, respectively, moves to the high state, in turn, to enable sampling on one of the four respective channels of a time interleaved ADC. The CLK signal input transitions from the low state to the high state control the falling edges of Qp[0], Qp[1], Qp[2], and Qp[3] and trigger a sample being taken when each of the output sampling clocks Qp[0], Qp[1], Qp[2], and Qp[3] transition from the high state to the low state, as has been described for previous embodiments. For example, when SEL0 is in a high state and CLK transitions to a high state at time T0, this pulls Qp[0] to the low state of node 701 through MN[0], the common node N1, and MN_Pulldown by action of the CLK rising edge turning on MN_Pulldown. This pull down to the low state also happens for each of the falling edges of Qp[1], Qp[2], and Qp[3], as SEL1, SEL2, and SEL3 are each set high in turn and the CLK pulse is input to sampling circuitry 700 and transitions from a low state to a high state at times T1, T2, and T3. Timing mismatch between the falling edges of Qp[0], Qp[1], Qp[2], and Qp[3] is then minimized. For each of the outputs QP[n] of FIG. 6A, a pull-up circuit that includes each of the transistors MP[n] and MN_PU, and common node N2, is used to pull Qp[n] to the high state of node 702, through MP[n], the common node N2, and MN_PU, prior to the sampling being triggered by the CLK turning on MN_Pulldow.

In the discussions of the embodiments above, the switches and transistors are deemed to be ON when the control signal is high, and OFF when the control signal is low, as would be the case for an NMOS transistor, for example. However, it should be noted that the use of complementary switches and complementary drive levels is an equally viable option for implementing the switches. That is, PMOS transistors could replace NMOS transistors with a complementary gate drive circuit, and both NMOS and PMOS transistors can be used in parallel using both polarities of a control signal. Also while the embodiments were each shown with a particular number of sampling channels, one skilled in the art will realize that the embodiments have application to any number of interleaved channels.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

In one example embodiment, any number of electrical circuits of the FIGURES may be implemented on a motherboard of an associated electronic device. The motherboard can be a general circuit board that can hold various components of the internal electronic system of the electronic device and, further, provide connectors for other peripherals. More specifically, the motherboard can provide the electrical connections by which the other components of the system can communicate electrically. Any suitable processors (inclusive of digital signal processors, microprocessors, supporting chipsets, etc.), memory elements, etc. can be suitably coupled to the motherboard based on particular configuration needs, processing demands, computer designs, etc. Other components such as external storage, additional sensors, controllers for audio/video display, and peripheral devices may be attached to the motherboard as plug-in cards, via cables, or integrated into the motherboard itself.

In another example embodiment, the electrical circuits of the FIGURES may be implemented as stand-alone modules (e.g., a device with associated components and/or circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors and memory elements, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A circuit for generating a plurality of sampling clocks synchronized relative to one another to reduce timing mismatch for sampling of multiple analog signal channels, the circuit comprising:

first circuitry configured to receive a plurality of input signals and selectively set each sampling clock of the plurality of sampling clocks to a first output state, wherein a selected sampling clock of the plurality of sampling clocks is set to the first output state when a selected input of the plurality of input signals is set to a first input state; and second circuitry configured to receive an input clock signal and transition each of the plurality of sampling clocks to a second output state through a common path, wherein the selected sampling clock is transitioned from the first output state to the second output state through the common path in response to a transition of the input clock signal from a first clock state to a second clock state.

2. The circuit of claim 1, wherein the first output state of each of the sampling clocks has a voltage level and the first circuitry comprises at least one boost circuit configured to boost the voltage level of the first output state of each of the sampling clocks.

3. The circuit of claim 1, further comprising a sampling circuit including a plurality of sampling channels receiving the plurality of sampling clocks, the sampling circuit configured to generate a sample from a selected channel of the plurality of channels when the selected sampling clock is transitioned to the second output state from the first output state.

4. The circuit of claim 3, wherein the first output state of each of the plurality of sampling clocks has a voltage level and the first circuitry comprises at least one boost circuit configured to boost the voltage level of the first output state of each of the plurality of sampling clocks to drive at least one switch in the sampling circuit to an on state.

5. The circuit of claim 1, wherein the selected input comprises a selected input that is received at the first and second circuitry and the second circuitry further comprises a plurality of switches each corresponding to one of the plurality of sampling clocks, and each being configured to selectively connect each sampling clock through its corresponding switch to a first node when a selected input of the plurality of input signals is set to the first input state and, when the input clock signal is set to the second clock state, the selected sampling clock is transitioned to the second output state through the common path.

6. The circuit of claim 5, wherein the selected input that is received at the first circuitry and the selected input that is received at the second circuitry each comprise a same input of the plurality of input signals.

7. The circuit of claim 5, wherein the plurality of switches comprises a plurality of first switches and the common path comprises a second switch coupled between the first node and a second node held at the second output state, the second switch configured to connect the first node to the second node in response to a transition of the input clock signal from the first clock state to the second clock state.

8. The circuit of claim 7, wherein the first output state of each of the plurality of sampling clocks has a voltage level and the first circuitry comprises a plurality of pull-up-boost circuits each configured to set the voltage level of the first output state of a corresponding one of the plurality of sampling clocks to a boosted voltage level, and the first circuitry further comprises a plurality of a pull-down paths each associated with a switch of the plurality of first switches, wherein the selected sampling clock is connected to the first node through a selected pull-down path and a selected first switch in parallel when the selected input of the plurality of inputs that is received at the second circuitry is set to the first input state.

9. The circuit of claim 5, wherein the first circuitry further comprises a plurality of a pull-down paths each associated with a switch of the plurality of switches, wherein the selected sampling clock is connected to the first node through a selected pull-down path and a selected first switch in parallel when the selected input of the plurality of inputs that is received at the second circuitry is set to the first input state.

10. The circuit of claim 1, wherein the first circuitry further comprises pull-up circuitry to set the selected sampling clock of the plurality of sampling clocks to the first output state when the selected input is set to the first input state and the input clock signal is at the first clock state.

11. The circuit of claim 1, wherein a selected sampling clock comprises a first sampling clock and the second circuitry comprises:
a first switch having a first terminal coupled to a first node, a second terminal coupled to the first sampling clock of the plurality of sampling clocks, and a third terminal, the first switch configured to be in the on state when an input signal of the plurality of input signals that is received at the third terminal of the first switch is in a first input state and connect the first node to the first sampling clock;
a second switch having a first terminal coupled to the first node, a second terminal coupled to a second sampling clock of the plurality of sampling clocks, and a third terminal, the second switch configured to be in the on state when an input signal of the plurality of inputs that is received at the third terminal of the second switch is in the first input state, and connect the first node to the second sampling clock; and
a third switch having a first terminal coupled to a second node held at the second output state, a second terminal coupled to the first node, and a third terminal for receiving the input clock signal, the third switch configured to be in the on state when the input clock signal is in the second clock state and set the first node to the second output state.

12. The circuit of claim 1, wherein the first circuitry comprises a first boost circuit configured to provide a boosted voltage level on a first sampling clock and a second boost circuit configured to provide a boosted voltage level on a second sampling clock.

13. A method for sampling, comprising:
receiving a plurality of input signals;
setting a selected sampling clock of a plurality of sampling clocks to a first output state when one or more selected inputs of the plurality of input signals is set to a first input state;
receiving an input clock having successive transitions between a first clock state and a second clock state, the transitions from the first to the second clock state timed to occur about when the one or more selected inputs is in the first input state; and
setting the selected sampling clock that is in the first output state to a second output state by connecting the selected sampling clock to a node set at the second output state through a common path, wherein each of the plurality of sampling clocks is set to the second output state through a same common path.

14. The method of claim 13, wherein the setting comprises boosting the first output state by a predetermined voltage to provide the first output state with a boosted voltage.

15. The method of claim 13, further comprising:
receiving the plurality of sampling clocks at a plurality of sampling channels, wherein each of the plurality of sampling clocks is coupled to a sampling switch of a corresponding one of the plurality of sampling channels; and
initiating a sample on a selected channel of the plurality of sampling channels when the selected sampling clock is set from the first to the second output state.

16. The method of claim 13, wherein the common path comprises a switch configured to couple a common node to the node held at the second output state, and wherein the switch is switched on by each input clock transition from the first to the second clock state.

17. The method of claim 16, wherein the switch comprises a first switch and the common node is coupled to each of the plurality of sampling clocks through one of a plurality of second switches, and the setting comprises:

connecting the selected sampling clock to the common node through a selected switch of the second plurality of switches when the one or more inputs is in the first input state; and setting, on each clock transition from the first to the second clock state, the selected sampling clock to the second output state by connecting the selected sampling clock to the node held at the second output state through the first switch.

18. The method of claim 17, wherein the connecting the selected sampling clock to the common node comprises connecting the selected sampling clock to the common node through a selected switch of the second plurality of switches and a parallel pull-down path when the one or more inputs is in the first input state.

19. A circuit for sampling, comprising:
means for receiving a plurality of input signals;
means for setting a selected sampling clock of a plurality of sampling clocks to a first output state when one or more selected inputs of the plurality of input signals is set to a first input state;
means for receiving an input clock having successive transitions between a first clock state and a second clock state, the transitions from the first to the second clock state timed to occur about when the one or more selected inputs is in the first input state; and
means for setting the selected sampling clock that is in the first output state to a second output state through a common path by connecting the selected sampling clock to a node set at the second output state, wherein each of the plurality of sampling clocks is set to the second output state through a same common path.

20. The circuit of claim 19, wherein the means for setting a selected sampling clock of a plurality of sampling clocks to a first output state comprises means for boosting the first output state by a predetermined voltage to provide the first output state at a boosted voltage.

21. The circuit of claim 19, further comprising:
means for receiving the plurality of sampling clocks at a plurality of sampling channels, wherein each of the plurality of sampling clocks is coupled to a sampling switch of a corresponding one of the plurality of sampling channels; and
means for initiating a sample on a selected channel of the plurality of sampling channels when the selected sampling clock is set from the first to the second output state.

22. The circuit of claim 19, wherein the common path comprises switching means configured to couple a common node to the node held at the second output state, and wherein the switching means is switched on by each input clock transition from the first to the second clock state.

23. The circuit of claim 22, wherein:
the switching means comprises:
a first switch and the common node is coupled to each of the plurality of sampling clocks through one of a plurality of second switches; and
the means for setting comprises:
means for connecting the selected sampling clock to the common node through a selected switch of the second plurality of switches when the one or more inputs is in the first input state; and
means for setting, on each clock transition from the first to the second clock state, the selected sampling clock to the second output state by connecting the selected sampling clock to the node held at the second output state through the first switch.

24. The circuit of claim 19, wherein:
the means for connecting the selected sampling clock to the common node comprises means for connecting the selected sampling clock to the common node through a selected switch of the second plurality of switches and a parallel pull-down path when the one or more inputs is in the first input state.

* * * * *